United States Patent [19]

Nakazato et al.

[11] Patent Number: 4,769,687
[45] Date of Patent: Sep. 6, 1988

[54] LATERAL BIPOLAR TRANSISTOR AND METHOD OF PRODUCING THE SAME

[75] Inventors: Kazuo Nakazato, Hachioji; Tohru Nakamura, Tanashi; Masataka Kato, Kokubunji; Takahiro Okabe, Nishitama, all of Japan

[73] Assignee: Hitachi, Ltd., Tokyo, Japan

[21] Appl. No.: 40,125

[22] Filed: Apr. 20, 1987

Related U.S. Application Data

[63] Continuation of Ser. No. 701,160, Feb. 13, 1985, abandoned.

[30] Foreign Application Priority Data

Feb. 15, 1984 [JP] Japan .................................. 59-25029

[51] Int. Cl.[4] ...................... H01L 29/72; H01L 29/54; H01L 27/04
[52] U.S. Cl. ........................................ 357/35; 357/44; 357/46; 357/59; 357/92
[58] Field of Search ...................... 357/34, 35, 59, 44, 357/92, 46

[56] References Cited

U.S. PATENT DOCUMENTS

| | | | |
|---|---|---|---|
| 4,333,227 | 6/1982 | Horng et al. | 357/34 |
| 4,339,767 | 7/1982 | Horng et al. | 357/44 |
| 4,508,579 | 4/1985 | Goth et al. | 148/175 |

Primary Examiner—Andrew J. James
Assistant Examiner—John Lamont
Attorney, Agent, or Firm—Antonelli, Terry & Wands

[57] ABSTRACT

A lateral bipolar transistor affording a good controllability for a base length is disclosed.

In fabricating a lateral bipolar transistor by forming a single crystal column and disposing heavily doped polycrystalline regions on both sides of the column, contact surfaces between the single crystal column and the heavily doped polycrystalline regions are controlled by etching of an oxide film. The etching of the oxide film can provide a device of a precision higher than attained by controlling any other element.

16 Claims, 9 Drawing Sheets

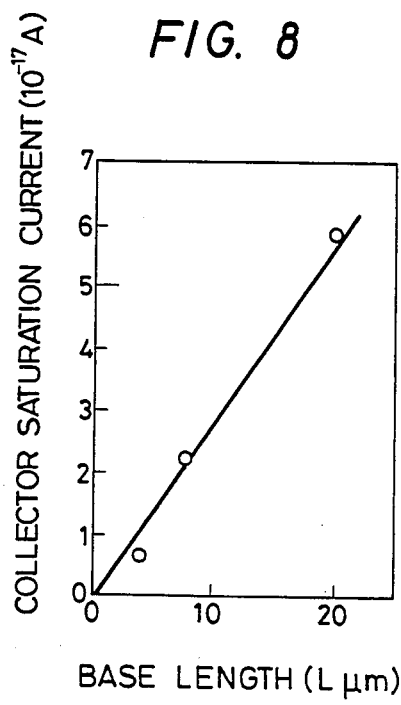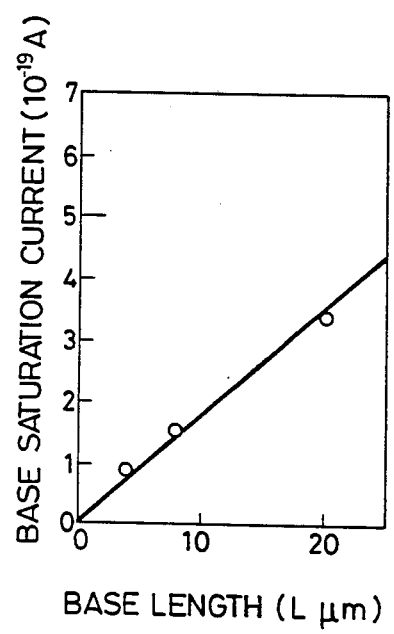

LATERAL BIPOLAR TRANSISTOR AND METHOD OF PRODUCING THE SAME

This is a continuation of application Ser. No. 701,160, filed Feb. 13, 1985, now abandoned.

BACKGROUND OF THE INVENTION

The present invention relates to the structure of a semiconductor device, and more particularly to high-density lateral bipolar transistors having the performances of high operating speed and low power dissipation.

FIG. 1 shows a sectional structural view of a prior-art lateral p-n-p transistor. An impurity is diffused selectively into the surface of a p-type substrate 11, to form an n+-type buried layer 14. Thereafter, an n-type epitaxial layer 15 is grown and is doped with boron from its surface so as to form p-type regions 12 and 13. Further, it is doped with phosphorus to form an n+-type layer 16. The portion 12 is used as an emitter layer, the portion 15 as a base layer, and the portion 13 as a collector layer. The diffused layers 14 and 16 are used as a low resistivity layer for leading out the base region to an electrode 17B. In the figure, symbol 17E denotes an emitter electrode, symbol 17C a collector electrode, symbol 17B the base electrode, and numeral 10 an insulator. The prior-art p-n-p transistor shown in FIG. 1 is extensively employed owing to a simple fabrication process, but it has disadvantages to be mentioned below:

(1) In a transistor action, holes injected from an emitter to a base should preferably be all collected to a collector. With the structure shown in FIG. 1, however, most of holes injected from the bottom part of the emitter diffused layer 12 flow out to the base electrode 17B through the diffused layer 14. In consequence, the power dissipation increases, and the current gain decreases.

(2) The emitter electrode 17E and collector electrode 17C must be taken out from holes (contact holes) which are smaller than the emitter diffused region 12 and collector diffused region 13, respectively. Therefore, the emitter and collector diffused regions become at least larger than the contact holes. The size of the contact holes is determined by lithography, and it is difficult to be rendered small. More specifically, the size of the contact holes is reduced to the utmost. Accordingly, the regions of the diffused layers 12 and 13 infallibly become larger than the smallest possible size of the contact holes. Consequently, the emitter-base junction capacitance and the collector-base junction capacitance increase in proportion to the resulting larger junction areas, to worsen the high frequency characteristics of the transistor.

(3) The switching speed of a transistor is determined by the charges of electrons and hole which are stored within the transistor. Holes stored underneath the emitter layer 12 and collector layer 13 degrade the operating speed of the transistor drastically.

FIG. 2 shows a plan view of another prior-art lateral p-n-p transistor devised in order to eliminate the above disadvantages, while FIG. 3 shows a structural sectional view taken along II—II' in FIG. 2. An impurity is diffused into the surface of a p-type substrate 11, thereby to form an n+-type region 14. The whole surface is thereafter oxidized to form a thermal oxide film 22. After selectively etching parts of the oxide film 22, an epitaxial layer is grown on the whole surface. A single crystal layer 15 is grown on a part 20 at which the substrate is exposed, while a polycrystalline silicon layer 21 (21E, 21C) is grown on the insulator 22. Using a mask, regions 21E, 21C, 12 and 13 are selectively doped with boron, to form the emitter diffused region 12 and the collector diffused region 13. The unnecessary part of the polycrystalline silicon not to be used for the transistor is selectively removed by employing a mask. Thus, the lateral p-n-p transistor in FIGS. 2 and 3 is formed. In this example, the portion 21E underneath an emitter electrode 17E and the portion 21C underneath a collector electrode 17C are electrically insulated from the substrate 11 or diffused layer 14 by the silicon oxide film 22, so that the emitter-base junction capacitance and the collector-base junction capacitance decrease.

Further, carriers to be stored decrease.

Accordingly, the lateral p-n-p transistor of low power dissipation and high operating speed is realized. Such an example is disclosed in Japanese Patent Application Publication No. 53-23669, and an example of a vertical bipolar transistor is disclosed in U. S. Pat. No. 3,600,651. Even with the technique, however, the following disadvantages are involved:

(I) When current to flow through a transistor has been determined, the voltage difference $V_{BE}$ between the base and emitter thereof is determined by a base length L. This base length L is determined by the etching of a polycrystalline silicon layer. More specifically, the emitter-base junction is determined by the interface between the region 12 and the region 15, and the collector-base junction by the interface between the region 13 and the region 15. They are proportional to the etching width L of the polycrystalline silicon layer. The polycrystalline silicon layer is as thick as about 1 μm, and is liable to a non-uniform etching rate on account of an inferior crystallinity. Since the controllability of the etching is inferior, the base length L must be rendered sufficiently great in order to fabricate a transistor of stable characteristics. In consequence, the occupation area of the element becomes large.

(II) A large number of crystal defects arise at the interface between the single crystal layer 15 and the polycrystalline layer 21, and it is unfavorable for transistor characteristics to use the interface as the base region of the transistor. For this reason, the emitter and collector diffused layers 12 and 13 need to be formed sufficiently internally of the opening 20 of the oxide film. Therefore, it is difficult to make the opening 20 small, and the occupation area of the element enlarges.

(III) The opening 20 of the oxide film 22 must lie inside the polycrystalline silicon layer 21. This is intended to prevent the substrate region 14 in the opening 20 from being etched by the etching step for the polycrystalline silicon layer 21. On account of such arrangement, a part 23 of the base region (FIG. 2) has a very poor crystallinity. Therefore, a leakage current arises through crystal defects. For this reason, the controllability of the collector current is inferior, and the transistor has characteristics which can be hardly employed in practical use. To the end of avoiding the drawback, such an improvement as etching and removing the region 23 or turning it into a silicon oxide film by a thermal step is considered. However, it makes the formation of a small-sized transistor difficult.

SUMMARY OF THE INVENTION

An object of the present invention is to eliminate the disadvantages stated above, and to provide a lateral bipolar transistor of favorable controllability, high performance and very small size.

The construction of the present invention for accomplishing the object consists in disposing an insulator at a part of the interface between a single crystal silicon region and a polycrystalline silicon region. In the second prior-art example described before, the single crystal region and the polycrystalline silicon region are simultaneously formed, and it is therefore impossible to form an insulator at the interface between them. The inventors have developed a new technique in which a single crystal region is formed first, whereupon a polycrystalline silicon layer is deposited and is connected with the single crystal layer.

Further, according to the present invention, a base lead-out electrode can be disposed just above a base region in order to stabilize a base potential.

BRIEF DESCRIPTION OF THE DRAWINGS

FIG. 8 is a graph showing the base length-dependence of a collector saturation current attained by the semiconductor device of the present invention;

FIG. 9 is a graph showing the base length-dependence of a base saturation current;

DETAILED DESCRIPTION OF THE INVENTION

Now, embodiments of the present invention will be described with reference to the drawings.

EMBODIMENT 1

Figure 4:
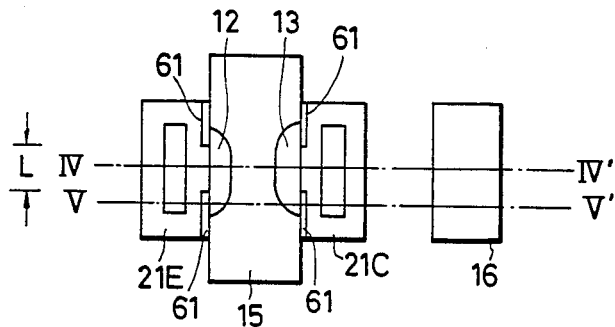
FIG. 4 is a plan view of a lateral p-n-p transistor according to the present invention.
Figure 5:
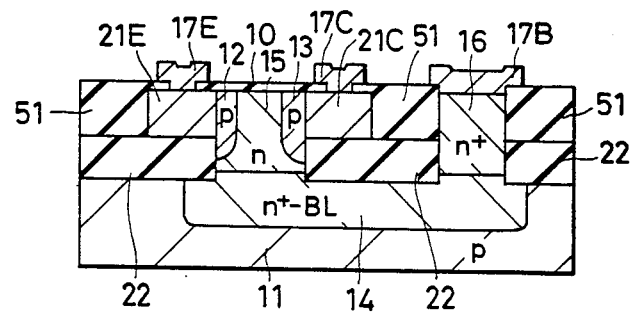
FIG. 5 is a sectional view taken along line IV—IV' in FIG. 4.
Figure 6:
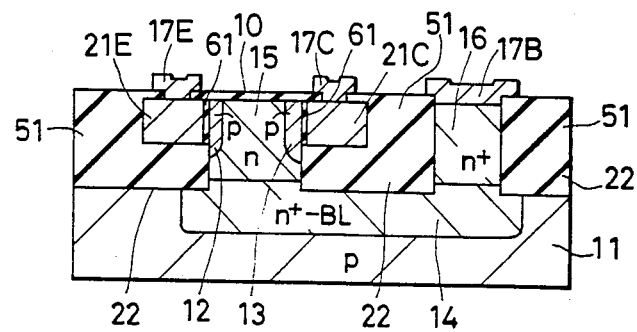
FIG. 6 is a sectional view taken along line V—V' in FIG. 4.

FIG. 4 shows a plan view of a lateral p-n-p transistor which is one embodiment of the present invention. FIG. 5 shows a structural sectional view along IV—IV' in FIG. 4, while FIG. 6 shows a structural sectional view along V—V' in FIG. 4. In order to clearly elucidate the present invention, the same symbols as those used in FIGS. 1 and 2 on the prior-art examples stated before shall indicate identical or equivalent portions unless otherwise specified.

In the present structure, emitter and collector diffused regions 12 and 13 are formed by the diffusion of a p-type impurity into single crystal silicon 15 from polycrystalline silicon 21 containing the p-type impurity at a high concentration. The entrance of the p-type impurity into the single crystal layer is limited to only the openings of silicon oxide films 61, and the length L of the openings determines the base length of the lateral p-n-p transistor. Of course, the base length becomes larger than the opening length L. This is attributed to the diffusion. The silicon oxide films 61 are formed by thermal oxidation or the like after the formation of the single crystal region 15, and they are selectively etched with a good controllability. Thereafter, the polycrystalline silicon layer 21 is formed.

Figure 7A:
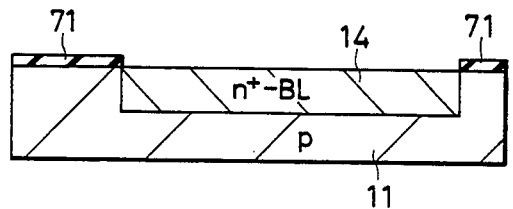
FIGS. 7A-7R are sectional views showing the manufacturing steps of a lateral p-n-p transistor according to the present invention.
Figure 7B:
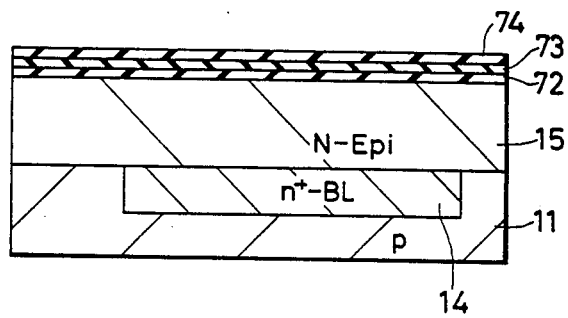
Figure 7C:
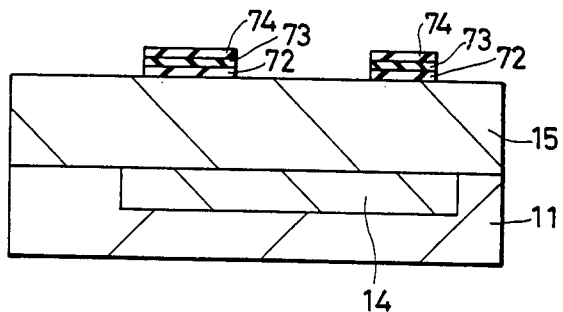
Figure 7D:
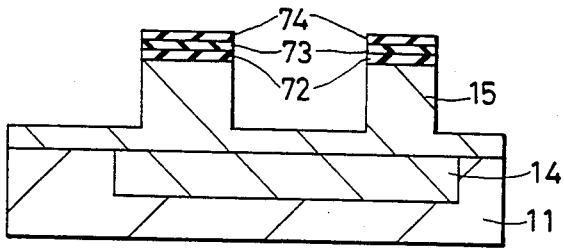
Figure 7E:
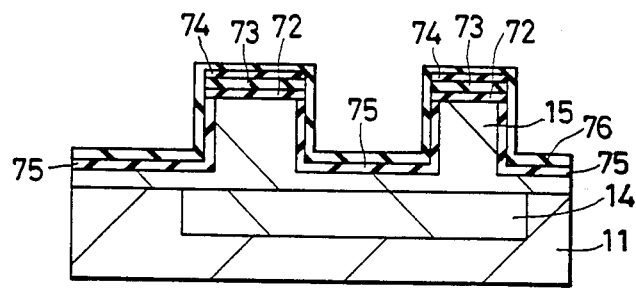
Figure 7F:
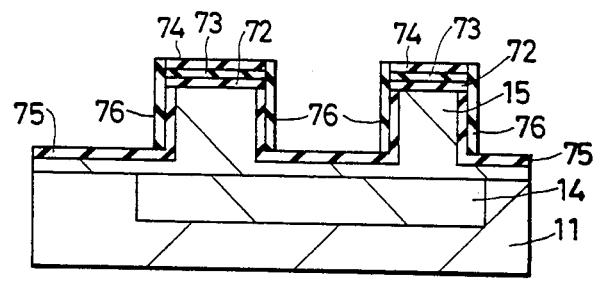
Figure 7G:
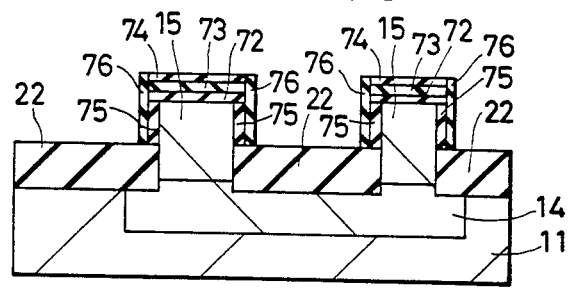
Figure 7H:
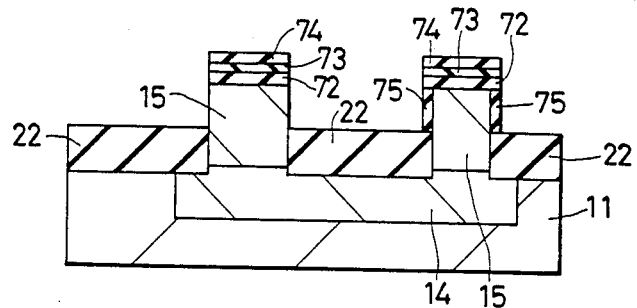
Figure 7I:
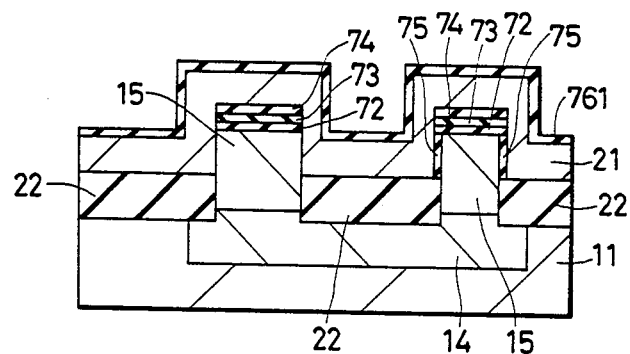
Figure 7J:
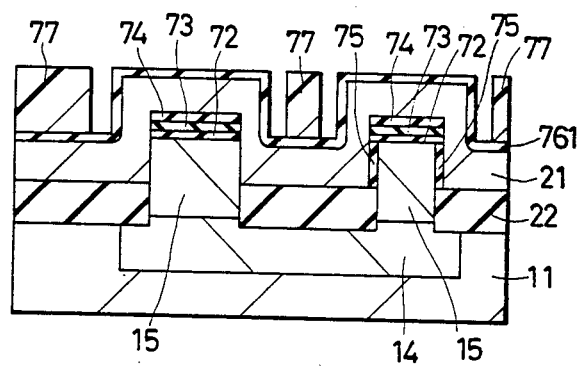
Figure 7K:
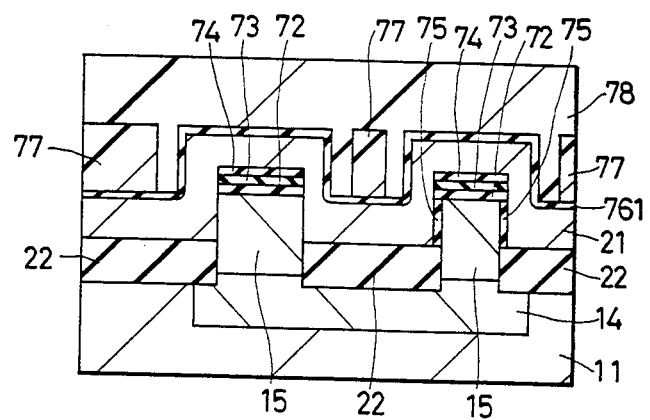
Figure 7L:
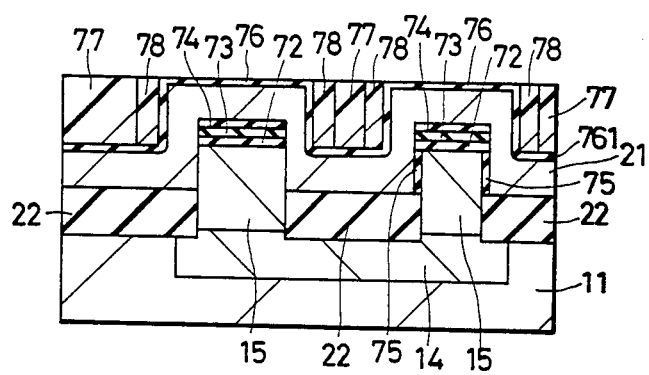
Figure 7M:
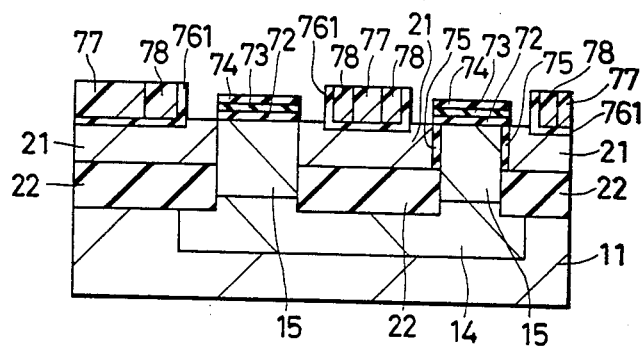
Figure 7N:
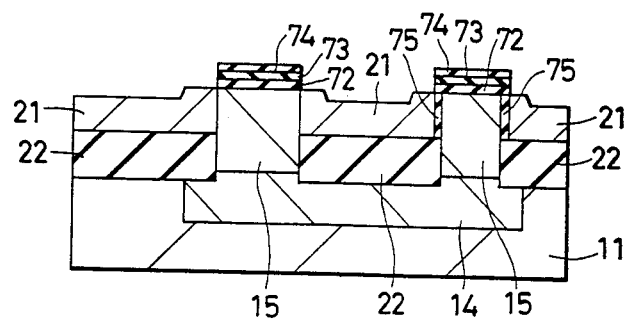
Figure 7O:
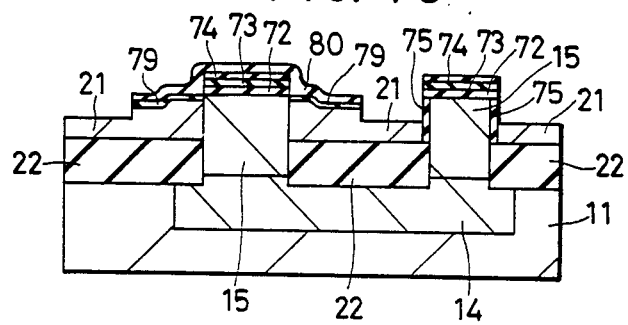
Figure 7P:
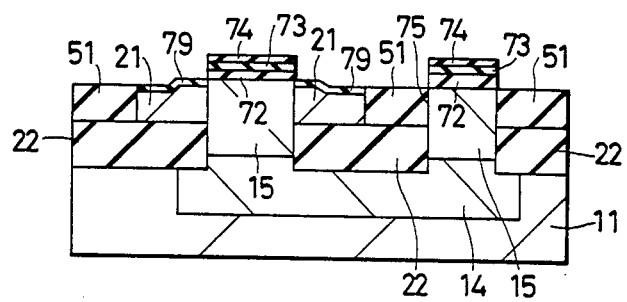
Figure 7Q:
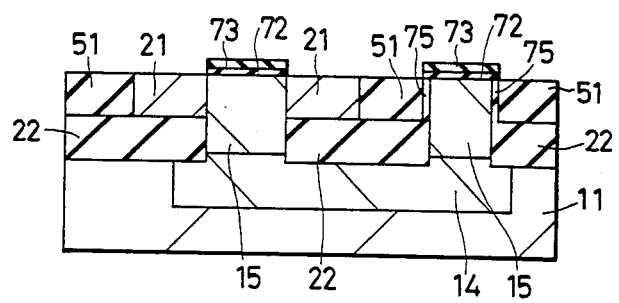
Figure 7R:
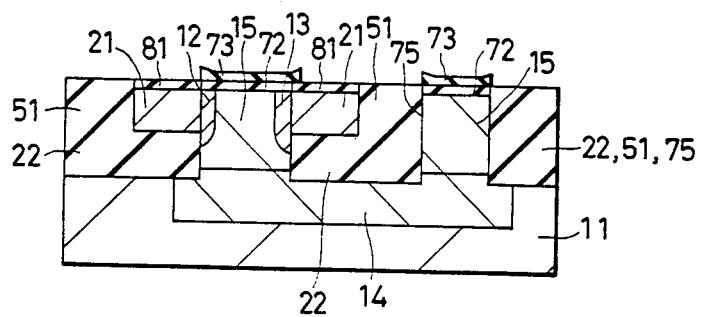

FIGS. 7A-7R show one example of a manufacturing process for realizing the semiconductor device of the present invention, and illustrate the situations before the structure of FIGS. 4-6 is formed. Hereunder, the producing steps will be explained in accordance with the figures.

FIG. 7A: A p-type semiconductor substrate 11 is prepared. Although an n-type substrate may be employed, impurities to be mentioned below must have the opposite conductivity types in that case. Unlike the substrate used as an electric conductor, a substrate in a broad sense in the form in which a conductor is placed on an insulator may well be employed. It is represented by SOI (Silicon on Insulator), SOS (Silicon on Sapphire) or the like.

The inventors selected as the substrate, one containing an impurity of the p-type and having an impurity concentration of $5 \times 10^{14}$ cm$^{-3}$.

The substrate is thermally oxidized to form a thin silicon oxide film 71 on the surface thereof. The inventors obtained the silicon oxide film 71 of 600 nm by performing a heat treatment at 1000° C. for 150 minutes. Next, an opening for forming an n$^+$-type buried layer 14 is provided in the silicon oxide film 71 by employing photolithography as in the prior art.

Using a process such as diffusion or ion implantation, the n$^+$-type buried layer 14 having a desired concentration is provided through the opening.

FIG. 7B: The silicon oxide film 71 is subsequently removed to expose the substrate surface, whereupon an n-type single crystal layer 15 is formed by the epitaxial growth.

The epitaxial layer 15 can be formed to a desired thickness, depending upon a period of time, a temperature etc. for or during the growth. The inventors obtained the epitaxial grown layer 15 of 1 μm.

Next, a thermal oxide film 72 is formed on the whole surface. The oxide film 72 may well be formed by deposition.

Next, a silicon nitride film 73 is formed by deposition. Further, a silicon oxide film 74 is formed by deposition. The inventors formed the three-layer film consisting of the oxide film 72, nitride film 73 and oxide film 74 which were 50 nm, 120 nm and 900 nm thick respectively.

FIG. 7C: The whole surface is coated with a photoresist which is then patterned, and parts of the three-layer film 72, 73, 74 are removed using the photoresist as a mask. Thereafter, the photoresist is removed.

FIG. 7D: Subsequently, using the three-layer film as a mask, the epitaxial grown layer is etched to form convex regions. Since anisotropic dry etching is used for the formation, side etching scarcely arises.

FIG. 7E: A thermal oxide film 75 is formed again. It may well be formed by deposition. In this case, however, the shape is somewhat different. Further, a silicon nitride film 76 is formed thereon by deposition. The inventors formed the silicon oxide film and the silicon nitride film which were 50 nm and 120 nm thick respectively.

FIG. 7F: Subsequently, the resultant structure is etched by anisotropic dry etching so as to leave the silicon nitride film 76 on only the side surfaces of the convex regions. Since the anisotropic dry etching is used, this step does not require any photo-mask for the etching.

FIG. 7G: Subsequently, using the silicon nitride film 76 as a mask, thermal oxidation is performed to form a thick oxide film 22. The inventors formed the oxide film of 700 nm.

FIG. 7H: Subsequently, the silicon nitride film 76 is removed, and further, the silicon oxide film 75 is removed. In removing the silicon oxide film, it is covered with a resist as a photo-mask in order that the oxide films may be left at the parts 61 of the side surfaces of the convex region as shown in FIG. 4. Therefore, the silicon oxide films 61 at the covered parts are not removed.

FIG. 7I: Polycrystalline silicon 21 is deposited on the whole surface, and further, a silicon oxide film 761 is formed by deposition.

The inventors deposited the polycrystalline silicon in two operations, in each of which it was deposited by 350 nm, to a total thickness of 700 nm, and formed the silicon oxide film by 200 nm.

FIG. 7J: The whole surface is coated with a resist 77, and that part of the resist which is somewhat larger than the convex regions is removed by a photo-mask step.

The inventors removed the resist in the part which was 1 μm outside one side of each convex region.

FIG. 7K: A photoresist 78 separate from the photoresist 77 is applied to the whole area, and its surface is flattened.

FIG. 7L: Sputter etching is performed in an $O_2$ atmosphere, to uniformly remove the photoresist 78 until the oxide film 76 is exposed.

FIG. 7M: The exposed oxide film is removed by wet etching, and the exposed parts of the polycrystalline silicon layer are removed by dry etching.

FIG. 7N: The photoresist layers 77, 78 and the oxide film 761 are removed.

FIG. 7O: A silicon oxide film 79 is formed on the surface of the polycrystalline silicon 21 by thermal oxidation, and a silicon nitride film 80 is deposited on the whole surface. Thereafter, parts of the silicon nitride film and the silicon oxide film are selectively removed by photo-mask steps.

Further, the polycrystalline silicon layer 21 is etched by dry etching so as to reduce its thickness. This step is performed in order to flatten the surface of the element later, but it may well be omitted.

FIG. 7P: Using the silicon nitride film 80 as a mask, the polycrystalline silicon is selectively oxidized to form an oxide film 51. Thereafter, the silicon nitride film 80 is removed, and the polycrystalline silicon is doped with boron by ion implantation.

FIG. 7Q: The silicon oxide films 74 and 79 are removed.

FIG. 7R: Using the silicon nitride film 73 as a mask, the surface of the polycrystalline silicon layer is oxidized to form a silicon oxide film 81. During this thermal step, the boron having been implanted by the step of FIG. 7P diffuses into the polycrystalline layer 15, so that the p-type regions 12 and 13 are formed.

At this time, the diffusion windows of the p-type regions are determined by the selective etching of the side wall oxide films 75 having been performed in FIG. 7H.

Thereafter, the silicon nitride film 73 is removed.

Contact holes for connecting electrodes are provided.

A metal such as aluminum (Al) is deposited, and is photo-etched into a desired pattern. It forms an emitter electrode 17E, a collector electrode 17C and a base electrode 17B.

Examples of the metal other than the aforementioned aluminum are tungsten (W), titanium (Ti) and their compounds with silicon (silicides).

In this way, the device of the structure shown in FIGS. 4–6 is produced.

Usually, a passivation film for protection is further formed.

Electrical characteristics attained by the semiconductor device of the present invention are illustrated in FIGS. 8 and 9. FIG. 8 shows the base length-dependence of a collector saturation current, and FIG. 9 that of a base saturation current. Here, the base length L is equal to the etching width of the side wall oxide films shown in FIG. 4. The currents flowing through the device are substantially proportional to L as illustrated in FIGS. 8 and 9, and it is understood that the operation is performed stably and precisely.

Figure 1:
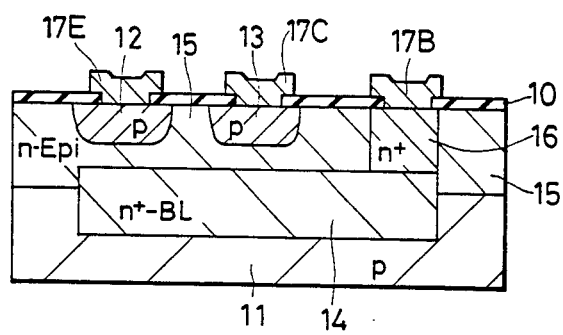
FIG. 1 is a sectional view showing a prior-art lateral p-n-p transistor.
Figure 2:
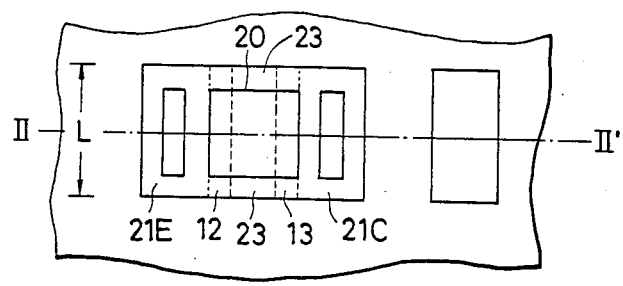
FIG. 2 is a plan view showing a prior-art improved lateral p-n-p transistor.
Figure 3:
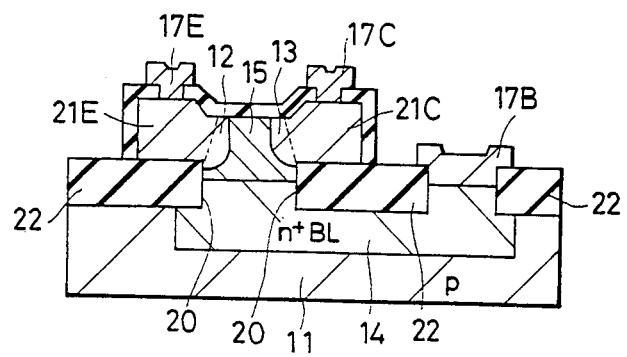
FIG. 3 is a sectional view taken along line II—II' in FIG. 2.

Furthermore, when viewed in a plan pattern, the device of the present invention becomes smaller to about ⅓ as compared with the prior-art semiconductor device in FIG. 1 and to about 1/5 as compared with the semiconductor device in FIG. 2, and it has the structure suited to microminiaturization.

EMBODIMENT 2

Now, a second embodiment of the present invention will be described in detail.

Figure 10:
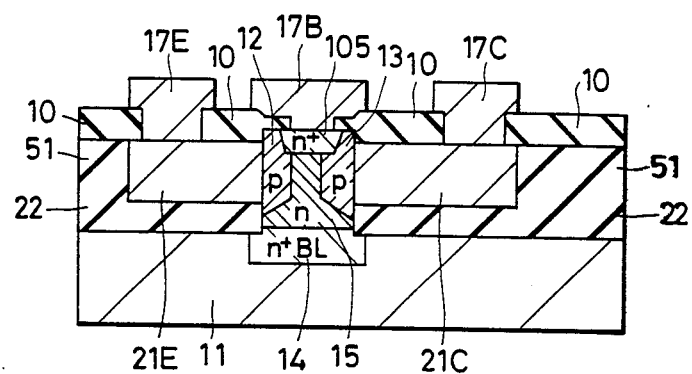
FIG. 10 is a sectional view showing a second embodiment of the present invention.

FIG. 10 is a sectional structural view showing the second embodiment of the semiconductor device of the present invention. In the figure, the same symbols as in the foregoing shall indicate identical or equivalent portions. The bipolar transistor of the present invention indicated by the embodiment has an $n^+$-type layer 105 on the surface of an n-type convex region 15 (including regions 12 and 13) and is provided with a base electrode 17B on the surface of the $n^+$-type layer. Therefore, a buried layer does not exist between the real base region and the base electrode. This brings forth the effect that the device is not affected by the state of the buried layer, so the dispersion of a collector current is avoided.

Thus, according to the second embodiment, the dispersion of the voltage between the base and the emitter of the transistor is minimized, and the element having stable characteristics can be provided.

More specifically, the dispersion of the collector current of a transistor is determined by the dispersion of a voltage applied to the transistor. A voltage $V_B$ to be applied to the real base of the lateral p-n-p transistor is obtained in such a way that a voltage drop $\Delta V_B$ in the buried layer extending from the base electrode to the real base region is subtracted from the voltage $V_B'$ applied to the base electrode. $\Delta V_B$ is expressed by $\Delta V_B = I_B R$ where R denotes the resistance ($10^2$–$10^3 \Omega$) of the buried layer, and $I_B$ the current flowing through the buried layer. Here, since R differs depending upon individual transistors, the dispersion of $\Delta V_B$ arises. Accordingly, to the end of suppressing the dispersion of the voltage to be applied to the real base, the dispersion of $\Delta V_B$ may be minimized.

According to the present invention, a base electrode is disposed directly over a real base region, whereby a voltage to be applied to the base electrode is equalized. That is, since a base current flows to the electrode portion directly without passing a buried layer, a voltage drop across the buried layer forming the cause of a dispersion is not involved.

EMBODIMENT 3

Figure 11:
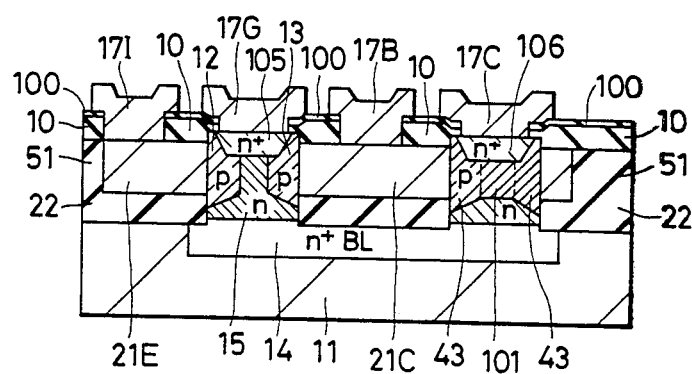
FIG. 11 is a sectional view showing a third embodiment of the present invention.

FIG. 11 is a sectional view showing a third embodiment of the present invention.

In an IIL circuit according to the present invention shown here, the first embodiment is employed for a lateral transistor portion, while a vertical transistor portion has a p+-type region 101 lying in direct contact with p-type regions 43 and is connected with the lateral transistor by a polycrystalline silicon layer 21C. Here, an injector is led out by an electrode 17I through a polycrystalline silicon layer 21C, and a base by an electrode 17B through the polycrystalline silicon layer 21C. In addition, the ground is led out by an electrode 17G, and a collector by an electrode 17C.

The ground terminal 17G of the I²L circuit exists on the surface of the active region of the lateral transistor. Therefore, even when the I²L circuit of FIG. 11 is applied to a large-scale integrated circuit, the dispersion of the injector currents of the individual I²L circuits is minimized, along with the effect of microminiaturization.

According to the present invention, no buried layer intervenes between the base electrode and the real base of a lateral p-n-p transistor portion, so that the dispersion of a base-emitter voltage $V_{BE}$ is avoided. Concretely, the dispersion of $V_{BE}$ having heretofore been approximately 8% with respect to the center value becomes 1% or less.

EMBODIMENT 4

This embodiment is obtained by combining Embodiment 1 with Embodiment 2 or 3 described before.

According to Embodiment 4, characteristics are further improved.

The base length is precisely controlled by the insulator film 61. Besides, since the base lead-out electrode is disposed directly over the base region, the voltage drop attributed to the resistance of the buried layer is not involved. Therefore, the base potential can be rendered constant without being influenced by the length of the buried layer.

What is claimed is:

1. A semiconductor device comprising:
    a semicoductor body;
    a first insulating film formed over a first main surface of said semiconductor body, said first insulating film including an opening which exposes a portion of the first main surface of said semiconductor body;
    a single crystal region having first and second main surfaces opposite to one another and first and second sidewalls located between said first and second main surfaces, said single crystal region being disposed in said opening in said first insulating film to have the first main surface of said single crystal region in contact with the first main surface of said semiconductor body;
    a first polycrystalline region disposed on a first portion of said first insulating film adjacent to said first sidewall of said single crystal region;
    a second polycrystalline region disposed on a second portion of said first insulating film adjacent to said second sidewall of said single crystal region;
    a second insulating film formed on said first sidewall of said single crystal region between said single crystal region and said first polycrystalline region, said second insulating film including an opening for allowing contact between predetermined portions of said first polycrystalline region and said first sidewall of said single crystal region;
    a third insulating film formed on said second sidewall of said single crystal region between said single crystal region and said second polycrystalline region, said third insulating film including an opening for allowing contact between predetermined portions of said second polycrystalline region and said second sidewall of said single crystal region; and
    a fourth insulating film formed on said first insulating film to contact said first and second polycrystalline silicon regions, wherein upper surfaces of said first and second polycrystalline regions and said fourth insulating films are substantially even with the second main surface of said single crystal region so that an upper surface of said semiconductor device is substantially flat.
    wherein said first and second portions of said first insulating film are substantially equal to one another in thickness.

2. A semiconductor device according to claim 1, wherein said single crystal region is formed by a epitaxial growth on said semiconductor body, and said first and second polycrystalline regions are formed by deposition.

3. A semiconductor device according to claim 2, wherein said first insulator film, said second insulator film and said third insulator film are thermal oxide films.

4. A semiconductor device according to claim 3, wherein said semiconductor body is of a first conductivity type and is a single crystal silicon substrate, said single crystal region is a single crystal silicon region formed by epitaxial growth on said semiconductor body, and said first and second polycrystalline regions are polycrystalline silicon regions.

5. A semiconductor device according to claim 4, wherein the first conductivity type is the p-type.

6. A lateral bipolar transistor according to claim 1, wherein said fourth insulating film is integrally formed with said first insulating film.

7. A lateral bipolar transistor according to claim 1, wherein said second and third insulating films are located over said first insulating film.

8. A semiconductor device comprising:
    a semiconductor body;
    a first insulating film formed over a first main surface of said semiconductor body, said first insulating film including an opening which exposes a portion of the first main surface of said semiconductor body;
    a single crystal region having first and second main surfaced opposite to one another and first and second sidewalls located between said first and second main surfaces, said single crystal region being disposed in said opening in said first insulating film to have the first main surface of said single crystal region in contact with the first main surface of said semiconductor body;

a first polycrystalline region disposed on said first insulating film adjacent to said first sidewall of said single crystal region;

a second polycrystalline region disposed on said first insulating film adjacent to said second sidewall of said single crystal region;

a second insulating film formed on said first sidewall of said single crystal region between said single crystal region and said first polycrystalline region, said second insulating film including an opening for allowing contact between predetermined portions of said first polycrystalline region and said first sidewall of said single crystal region;

a third insulating film formed on said second sidewall of said single crystal region between said single crystal region and said second polycrystalline region, said third insulating film including an opening for allowing contact between predetermined portions of said second polycrystalline region and said second sidewall of said single crystal region; and a fourth insulating film formed on said first insulating film to contact said first and second polycrystalline silicon regions, wherein upper surfaces of said first and second polycrystalline regions and said fourth insulating films are substantially even with the second main surface of said single crystal region so that an upper surface of said semiconductor device is substantially flat, wherein said single crystal region includes a first region of a first conductivity type, a second region of the first conductivity type and a third region of a second conductivity type interposed between the first and second regions, said first region being formed at the first sidewall of the single crystal region to contact the first polycrystalline region through said opening in said second insulating film, said second region being formed at the second sidewall of the single crystal region to contact the second polycrystalline region through said opening in said third insulating film, and the third region being formed to contact the first main surface of said semiconductor body so that said first, second and third regions form a lateral bipolar transistor with the first region being an emitter, the second region being a collector and the third region being a base, with a base length of said lateral bipolar transistor being controlled by the size of the openings in the second and third insulating films.

9. A semiconductor device according to claim 8, wherein a base-emitter junction and a base-collector junction of said lateral bipolar transistor are arranged within said single crystal region.

10. A semiconductor device according to claim 9, wherein said semiconductor body is of a first conductivity type and has a heavily doped region of a second conductivity type, which is connected with said first major surface of said single crystal region at said opening in said first insulator film.

11. A semiconductor device according to claim 8, wherein an electrode for said base overlies said base in contact therewith.

12. A lateral bipolar transistor according to claim 8, wherein said fourth insulating film is integrally formed with said first insulating film.

13. A lateral bipolar transistor according to claim 8, wherein said second and third insulating films are located over said first insulating film.

14. A semiconductor device comprising:

a semiconductor body;

a first insulating film formed over a first main surface of said semiconductor body, said first insulating film including an opening which exposes a portion of the first main surface of said semiconductor body;

a single crystal region having first and second main surfaces opposite to one another and first and second sidewalls located between said first and second main surfaces, said single crystal region being disposed in said opening in said first insulating film to have the first main surface of said single crystal region in contact with the first main surface of said semiconductor body;

a first polycrystalline region disposed on said first insulating film adjacent to said first sidewall of said single crystal region;

a second polycrystalline region disposed on said first insulating film adjacent to said second sidewall of said single crystal region;

a second insulating film formed on said first sidewall of said single crystal region between said single crystal region and said first polycrystalline region, said second insulating film including an opening for allowing contact between predetermined portions of said first polycrystalline region and said first sidewall of said single crystal region;

a third insulating film formed on said second sidewall of said single crystal region between said single crystal region and said second polycrystalline region, said third insulating film including an opening for allowing contact between predetermined portions of said second polycrystalline region and said second sidewall of said single crystal region; and a fourth insulating film formed on said first insulating film to contact said first and second polycrystalline silicon regions, wherein upper surfaces of said first and second polycrystalline regions are substantially even with the second main surface of said single crystal region so that an upper surface of said single crystal region and said first and second polycrystalline regions of said semiconductor device is substantially flat, and further wherein said single crystal region includes a first region of a first conductivity type, a second region of the first conductivity type and a third region of a second conductivity type interposed between the first and second regions, said first region being formed at the first sidewall of the single crystal region to contact the first polycrystalline region through said opening in said second insulating film, said second region being formed at the second sidewall of the single crystal region to contact the second polycrystalline region through said opening in said third insulating film, and the third region being formed to contact the first main surface of said semiconductor body so that said first, second and third regions form a lateral bipolar transistor with the first region being an emitter, the second region being a collector and the third region being a base, with a base length of said lateral bipolar transistor being controlled by the size of the openings in the second and third insulating films.

15. A lateral bipolar transistor according to claim 14 wherein said fourth insulating film is integrally formed with said first insulating film.

16. A lateral bipolar transistor according to claim 14, wherein said second and third insulating films are located over said first insulating film.

* * * * *